US012669910B2

(12) United States Patent
Lee

(10) Patent No.: US 12,669,910 B2
(45) Date of Patent: Jun. 30, 2026

(54) DISPLAY DEVICE INCLUDING AN INPUT-SENSING MEMBER

(71) Applicant: Samsung Display Co., Ltd., Yongin-si (KR)

(72) Inventor: Dongchun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/971,739

(22) Filed: Dec. 6, 2024

(65) Prior Publication Data

US 2025/0264968 A1 Aug. 21, 2025

(30) Foreign Application Priority Data

Feb. 16, 2024 (KR) ......................... 10-2024-0022383

(51) Int. Cl.
H10K 59/40 (2023.01)
G06F 3/041 (2006.01)
G06F 3/044 (2006.01)

(52) U.S. Cl.
CPC .......... G06F 3/0448 (2019.05); G06F 3/0412 (2013.01); G06F 3/04164 (2019.05); G06F 3/0443 (2019.05); G06F 3/0446 (2019.05); H10K 59/40 (2023.02); G06F 2203/04112 (2013.01)

(58) Field of Classification Search
CPC .. G06F 3/0448; G06F 3/0412; G06F 3/04164; G06F 3/0443; G06F 3/0446; G06F 2203/04112; H10K 59/40; G09G 2300/0452
See application file for complete search history.

(56) References Cited

U.S. PATENT DOCUMENTS

| | | | |
|---|---|---|---|
| 11,042,252 B2 | 6/2021 | Jeong et al. | |
| 11,054,957 B2 * | 7/2021 | Jang | G06F 3/0412 |
| 11,126,288 B2 | 9/2021 | Kim et al. | |
| 11,354,002 B2 | 6/2022 | Yang et al. | |

(Continued)

FOREIGN PATENT DOCUMENTS

| | | |
|---|---|---|
| KR | 10-2020-0113090 A | 10/2020 |
| KR | 10-2021-0004427 A | 1/2021 |

(Continued)

*Primary Examiner* — Stephen G Sherman
(74) *Attorney, Agent, or Firm* — Womble Bond Dickinson (US) LLP

(57) ABSTRACT

A display device includes: a display panel including: a base layer including a display area, and a non-display area adjacent to the display area; and a display element layer on the base layer; and an input sensing layer on the display element layer, and including: a first sensing insulating layer; a conductive layer on the first sensing insulating layer, and including a sensing area overlapping with the display area, and a non-sensing area overlapping with the non-display area; and a second sensing insulating layer on the conductive layer. The conductive layer includes: first sensing electrodes overlapping with the sensing area; second sensing electrodes, each including a first portion overlapping with the sensing area, and a second portion connected to the first portion and overlapping with the non-sensing area; and trace lines connected to the first sensing electrodes and the second sensing electrodes.

20 Claims, 13 Drawing Sheets

(56)                    References Cited

U.S. PATENT DOCUMENTS

| | | | |
|---|---|---|---|
| 11,379,066 B2 | 7/2022 | Ko et al. | |
| 11,442,545 B2 * | 9/2022 | Kim | G06F 3/016 |
| 2014/0300835 A1 * | 10/2014 | Chu | G06F 3/0446 |
| | | | 349/12 |
| 2019/0115411 A1 * | 4/2019 | Park | H10K 59/40 |
| 2021/0141491 A1 * | 5/2021 | Gogte | G06F 3/0446 |
| 2021/0399061 A1 * | 12/2021 | Ji | H10K 59/352 |
| 2022/0255038 A1 * | 8/2022 | Wang | H10K 77/111 |
| 2022/0350445 A1 * | 11/2022 | Bang | H10K 59/40 |

FOREIGN PATENT DOCUMENTS

| | | | |
|---|---|---|---|
| KR | 10-2021-0029062 A | 3/2021 |
| KR | 10-2322834 B1 | 11/2021 |
| KR | 10-2412371 B1 | 6/2022 |
| KR | 10-2471154 B1 | 11/2022 |

* cited by examiner

DISPLAY DEVICE INCLUDING AN INPUT-SENSING MEMBER

CROSS-REFERENCE TO RELATED APPLICATION

The present application claims priority to and the benefit of Korean Patent Application No. 10-2024-0022383, filed on Feb. 16, 2024, in the Korean Intellectual Property Office, the entire disclosure of which is incorporated by reference herein.

BACKGROUND

1. Field

Aspects of embodiments of the present disclosure relate to a display device including an input sensing member.

2. Description of Related Art

A display device senses external inputs applied thereto from the outside through a display area, and displays various images to provide a user with information. Recently, as display devices of various shapes are being developed, the shape of the display area is also diversifying.

In addition, optimized arrangements of sensing electrodes or wirings in an input sensing layer are being developed, while aiming to reduce a surrounding area and improve a display quality.

The above information disclosed in this Background section is for enhancement of understanding of the background of the present disclosure, and therefore, it may contain information that does not constitute prior art.

SUMMARY

One or more embodiments of the present disclosure may be directed to a display device having an improved sensor sensitivity.

According to one or more embodiments of the present disclosure, a display device includes: a display panel including: a base layer including a display area, and a non-display area adjacent to the display area; and a display element layer on the base layer; and an input sensing layer on the display element layer, and including: a first sensing insulating layer; a conductive layer on the first sensing insulating layer, and including a sensing area overlapping with the display area, and a non-sensing area overlapping with the non-display area; and a second sensing insulating layer on the conductive layer. The conductive layer includes: first sensing electrodes overlapping with the sensing area; second sensing electrodes, each including a first portion overlapping with the sensing area, and a second portion connected to the first portion and overlapping with the non-sensing area; and trace lines connected to the first sensing electrodes and the second sensing electrodes.

In an embodiment, each of the first sensing electrodes may have a polygonal shape, and the first portion of each of the second sensing electrodes may have a shape corresponding to a cut out of a portion of the first sensing electrodes.

In an embodiment, each of the trace lines may be connected to a corresponding one of the first sensing electrodes or a corresponding one of the second sensing electrodes in the display area.

In an embodiment, an area boundary between the display area and the non-display area may have a circular shape, and an electrode boundary overlapping with the area boundary between the first portion and the second portion may have a curved-line shape.

In an embodiment, an area boundary between the display area and the non-display area may have a polygonal shape, and an electrode boundary overlapping with the area boundary between the first portion and the second portion may have a straight line shape or a polygonal shape.

In an embodiment, each of the first sensing electrodes and the first portion may include a first conductive line including first mesh lines extending in a first diagonal direction, and second mesh lines extending in a second diagonal direction and crossing the first mesh lines. The first mesh lines and the second mesh lines may cross each other to define first mesh openings.

In an embodiment, the display element layer may include pixels including: a light emitting element; and a pixel definition layer through which a pixel opening may be defined. A light emitting area defined by an area where the light emitting element is exposed through the pixel opening may overlap with each of the first mesh openings.

In an embodiment, the light emitting area may include: a first light emitting area configured to display a red color, extending in the first diagonal direction between a first direction and a second direction crossing the first direction, and having a bar shape; a second light emitting area configured to display a green color, extending in the first diagonal direction, and having a bar shape; and a third light emitting area configured to display a blue color, and having a lozenge shape.

In an embodiment, the second portion may include a second conductive line including third mesh lines extending in the first diagonal direction, and fourth mesh lines extending in the second diagonal direction and crossing the third mesh lines. The third mesh lines and the fourth mesh lines may cross each other to define second mesh openings.

In an embodiment, the second conductive line of the second portions may have a line width greater than a line width of the first conductive line of the first portions.

In an embodiment, each of the second portions may have a continuous shape without being disconnected in an area overlapping with the non-display area.

In an embodiment, the display element layer may include light emitting elements, and the second mesh openings may not overlap with the light emitting elements.

In an embodiment, the second sensing electrodes may have a size greater than or equal to about 0.9 times and smaller than or equal to about 1.1 times of a size of the first sensing electrodes in a plan view.

In an embodiment, the display element layer may further include: a first electrode; and a second electrode on the first electrode, and overlapping with at least a portion of the non-display area. The second portion of each of the second sensing electrodes may overlap with the second electrode.

In an embodiment, the second sensing electrodes may have a capacitance greater than or equal to about 0.9 times and smaller than or equal to about 1.1 times of a capacitance of the first sensing electrodes.

In an embodiment, the second sensing electrodes may include first, second, and third portions, and the first, second, and third portions may be connected to each other and may be integral with each other.

In an embodiment, the display device may further include an integrated circuit at one side of the display panel. The trace lines may not overlap with each other, may extend in a direction toward the one side, and may be connected to the integrated circuit.

In an embodiment, the first sensing electrodes may have a rectangular shape in a plan view, and may be arranged along a first direction and a second direction perpendicular to the first direction.

In an embodiment, the second sensing insulating layer may cover the conductive layer, and an edge of the second sensing insulating layer may be spaced from an edge of the display panel.

In an embodiment, each of the first sensing electrodes and the second sensing electrodes may be a self-capacitance touch sensor.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
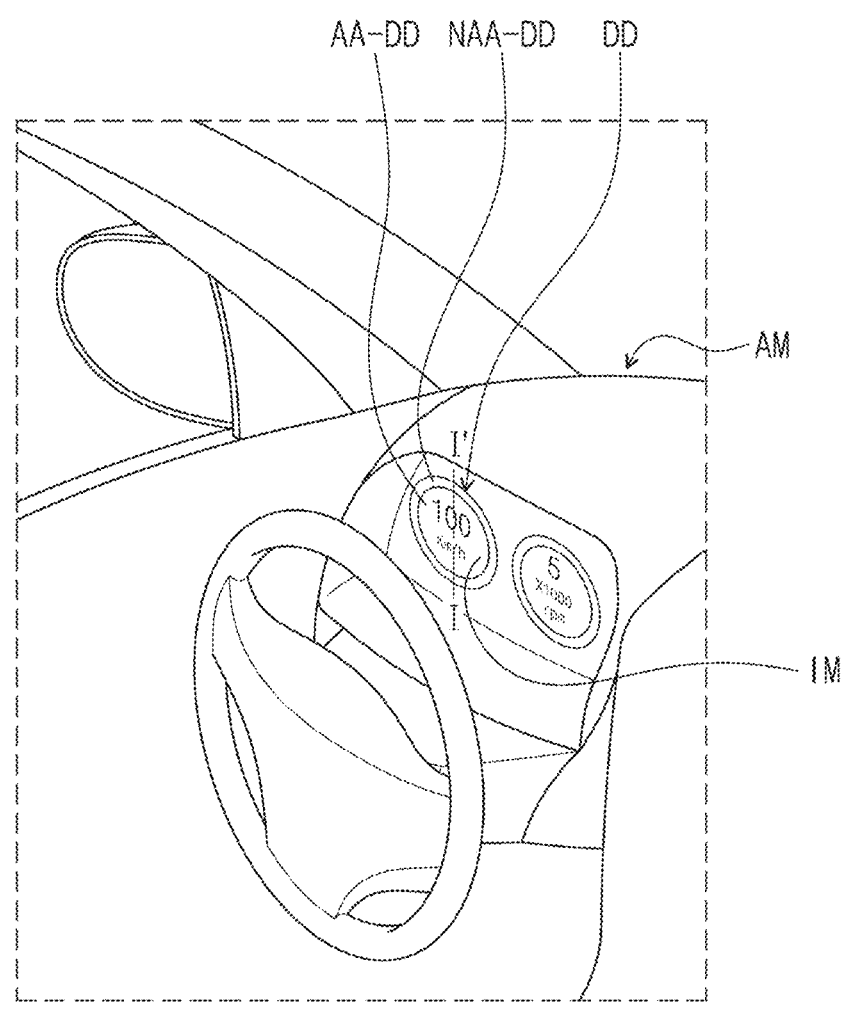
FIG. 1 is a perspective view of a display device according to an embodiment of the present disclosure.
Figure 1:
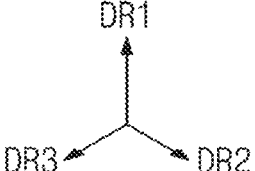

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it should be expected that the shapes shown in the figures may vary in practice depending, for example, on tolerances and/or manufacturing techniques. Accordingly, the embodiments of the present disclosure should not be construed as being limited to the specific shapes shown in the figures, and should be construed considering changes in shapes that may occur, for example, as a result of manufacturing. As such, the shapes shown in the drawings may not depict the actual shapes of areas of the device, and the present disclosure is not limited thereto.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
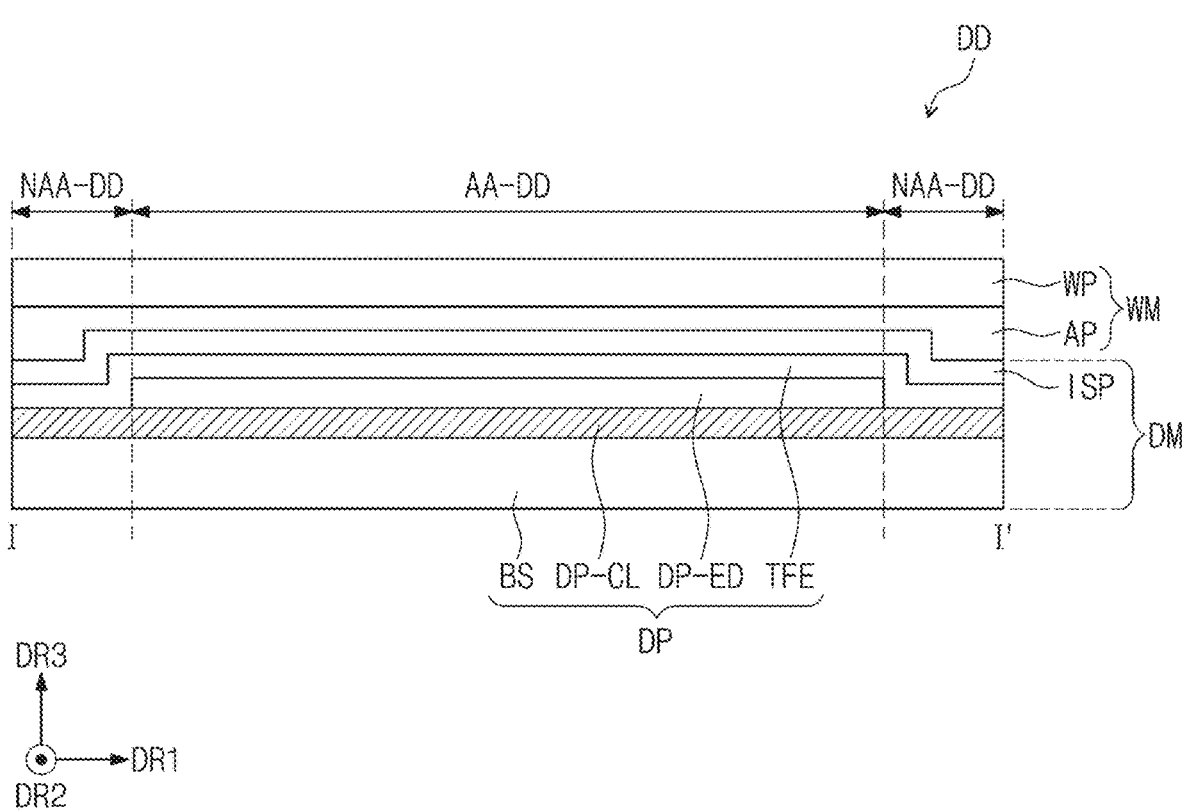
FIG. 2 is a cross-sectional view taken along the line I-I' of FIG. 1.

FIG. 1 is a perspective view of a display device DD according to an embodiment of the present disclosure. FIG. 2 is a cross-sectional view taken along the line I-I' of FIG. 1.

Referring to FIGS. 1 and 2, the display device DD may be activated in response to electrical signals. The display device DD may be provided in various suitable forms. As an example, the display device DD may be a mobile phone, a tablet computer, a car navigation unit (e.g., a navigation device), a game unit (e.g., a game console), or a wearable device, but the present disclosure is not limited thereto or thereby.

As a representative example, FIG. 1 shows the display device DD that is provided in the form of a display included in a center information display (CID) or a digital dash for an automobile AM.

The display device DD may include a display area AA-DD and a non-display area NAA-DD.

The display area AA-DD may be an area through which an image IM is displayed. As an example, FIG. 1 shows speed information of the automobile AM that is displayed as the image IM.

The image IM may not be displayed through the non-display area NAA-DD. The non-display area NAA-DD may surround (e.g., around a periphery of) the display area AA-DD. Accordingly, the display area AA-DD may have a shape that is substantially determined by the non-display area NAA-DD, but the present disclosure is not limited thereto. For example, in some embodiments, the non-display area NAA-DD may be disposed to be adjacent to only one side of the display area AA-DD, or may be omitted as needed or desired.

The display area AA-DD may be parallel to or substantially parallel to a plane defined by a first direction DR1 and a second direction DR2, which crosses or intersects the first direction DR1.

An upper surface (e.g., a front surface) and a lower surface (e.g., a rear surface) of each member are defined with respect to a direction to which the image IM is displayed. The upper and lower surfaces face each other (or are opposite to each other) in a third direction DR3. A normal line direction of each of the upper and lower surfaces may be parallel to or substantially parallel to the third direction DR3. However, the directions indicated by the first, second, and third directions DR1, DR2, and DR3 may be relative to each other, and thus, and may be variously modified to other suitable directions.

Referring to FIG. 2, the display device DD may include a display module (e.g., a display layer, a display, or a touch-display) DM and a window module (e.g., a window or a window layer) WM.

The display module DM may have a suitable configuration that is appropriate to generate the image, and may sense an input applied thereto from the outside. The display module DM may include a display panel DP, and an input sensing layer ISP disposed on the display panel DP.

The display panel DP may have a suitable configuration that is appropriate to generate the image. The display panel DP may be a light emitting kind of display panel. For example, the display panel DP may be an organic light emitting display panel, an inorganic light emitting display panel, a quantum dot display panel, a micro-LED display panel, or a nano-LED display panel.

The display panel DP may include a base layer BS, a circuit element layer DP-CL, a display element layer DP-ED, and an encapsulation layer TFE.

The base layer BS may provide a base surface on which the circuit element layer DP-CL is disposed.

The base layer BS may be a rigid substrate, or a flexible substrate that is bendable, foldable, or rollable. The base layer BS may be a glass substrate, a metal substrate, or a polymer substrate, but the present disclosure is not limited thereto or thereby. According to an embodiment, the base layer BS may include an inorganic layer, an organic layer, or a composite material layer.

The base layer BS may have a multi-layered structure. For example, the base layer BS may include a first synthetic resin layer, an intermediate layer having a single-layer or multi-layered structure, and a second synthetic resin layer disposed on the intermediate layer. The intermediate layer may be referred to as a base barrier layer. The intermediate layer may include a silicon oxide (SiOx) layer, and an amorphous silicon (a-Si) layer disposed on the silicon oxide layer, but the present disclosure is not limited thereto. As an example, the intermediate layer may include at least one of a silicon oxide layer, a silicon nitride layer, a silicon oxynitride layer, and/or an amorphous silicon layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and/or a perylene-based resin.

The circuit element layer DP-CL may be disposed on the base layer BS. The circuit element layer DP-CL may include an insulating layer, a semiconductor pattern, a conductive pattern, and a signal line. The insulating layer, a semiconductor layer, and a conductive layer may be formed on the base layer BS by a coating process or a depositing process, and the insulating layer, the semiconductor layer, and the conductive layer may be selectively patterned through several photolithography processes. As such, the semiconductor pattern, the conductive pattern, and the signal line included in the circuit element layer DP-CL may be formed.

The display element layer DP-ED may be disposed on the circuit element layer DP-CL. The display element layer DP-ED may include a light emitting element. For example, the display element layer DP-ED may include an organic light emitting material, an inorganic light emitting material, an organic-inorganic light emitting material, a quantum dot, a quantum rod, a micro-LED, or a nano-LED.

The encapsulation layer TFE may be disposed on the display element layer DP-ED. The encapsulation layer TFE may prevent or substantially prevent moisture, oxygen, and/or a foreign substance, such as dust particles, from entering the display element layer DP-ED.

The input sensing layer ISP may be disposed on the display panel DP. The input sensing layer ISP may sense the external input applied thereto from the outside. The external input may be a user's input. The user's input may include various suitable forms of external inputs, such as a part of the user's body, a pen, light, heat, or pressure.

The input sensing layer ISP may be formed on the display panel DP through successive processes. In this case, the input sensing layer ISP may be disposed directly on the display panel DP. As used herein, the expressions the "input sensing layer ISP is disposed directly on the display panel DP" and the "input sensing layer ISP is directly on the display panel DP" means that no intervening elements are present between the input sensing layer ISP and the display panel DP. In other words, a separate adhesive member may not be disposed between the input sensing layer ISP and the display panel DP. However, the present disclosure is not limited thereto or thereby, and the input sensing layer ISP may be connected with (e.g., coupled with or attached with) the display panel DP by an adhesive member. The adhesive member may be any suitable kind of adhesive as would be understood by those having ordinary skill in the art.

In some embodiments, the display module DM may further include an optical layer disposed on the input sensing layer ISP. The optical layer may be an anti-reflective layer to reduce a reflectance with respect to external light incident into the display module DM from the outside of the display module DM. The optical layer may include a polarization plate or a color filter layer.

The window module WM may be disposed on the display module DM. The window module WM may cover an entire or substantially entire outside of the display module DM.

The window module WM may have a suitable shape corresponding to the shape of the display module DM. According to the display device DD, the window module WM may include an optically transparent insulating material. The window module WM may be a glass substrate or a polymer substrate. As an example, the window module WM may include (e.g., may be) a tempered glass substrate.

The window module WM may include a base substrate WP formed of an optically transparent insulating material. The base substrate WP may include the optically transparent insulating material. The base substrate WP may include at least one of a glass substrate and/or a synthetic resin film. The base substrate WP may have a single-layer structure or a multi-layered structure in which multiple films are combined with each other. The window module WM may further include a functional layer, such as an anti-fingerprint layer, a phase-control layer, or a hard coating layer, which is disposed on the base substrate WP.

The window module WM may further include an adhesive layer AP. The base substrate WP and the display module DM may be connected with (e.g., coupled with or attached with) each other by the adhesive layer AP. However, the present disclosure is not limited thereto or thereby. According to an embodiment, the adhesive layer AP may be omitted as needed or desired, and the window module WM may be disposed directly on the display module DM.

Figure 3:
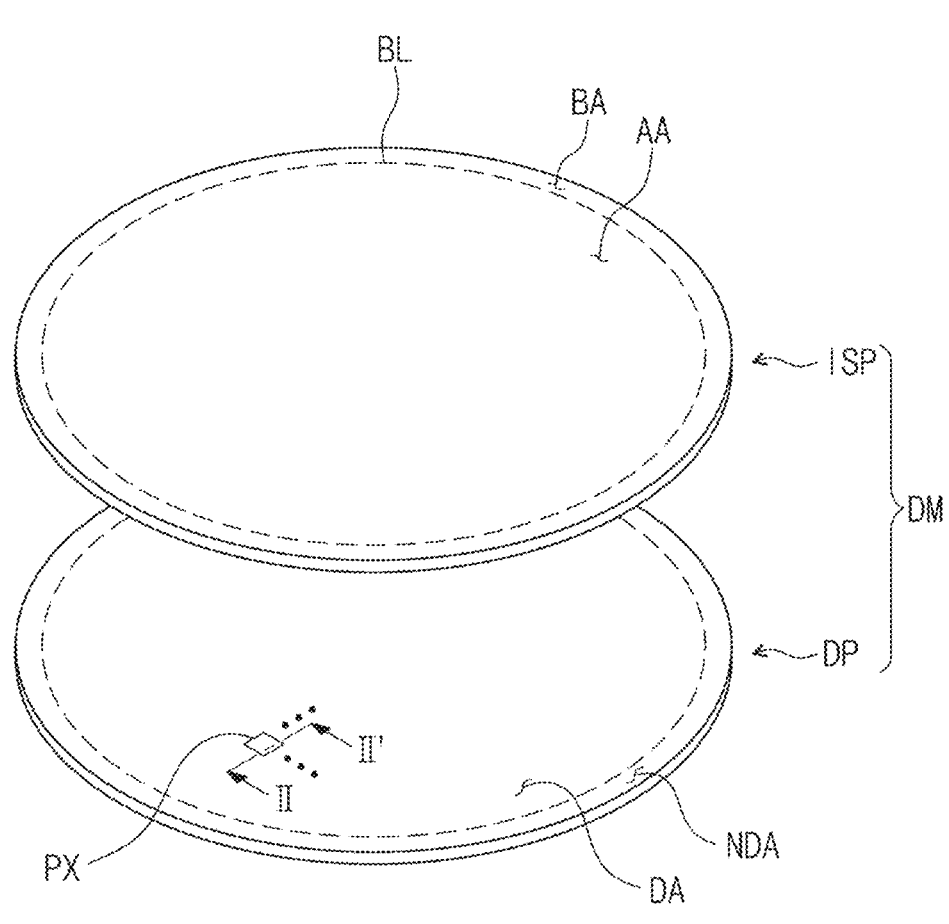
FIG. 3 is an exploded perspective view of a display module according to an embodiment of the present disclosure.

FIG. 3 is an exploded perspective view of the display module DM according to an embodiment of the present disclosure.

The input sensing layer ISP may include a sensing area AA and a non-sensing area BA. The sensing area AA may correspond to the display area AA-DD of the display device DD described above with reference to FIG. 1. The non-sensing area BA may correspond to the non-display area NAA-DD of the display device DD described above with reference to FIG. 1.

An area boundary BL may be defined between the sensing area AA and the non-sensing area BA. The area boundary BL may have a suitable shape that is determined by the shape of the sensing area AA. In FIG. 3, the area boundary BL, which has a circular shape, is shown as a dotted line, but the shape of the area boundary BL is not particularly limited thereto. As an example, the shape of the area boundary BL may be a polygonal shape or an irregular shape.

The display panel DP may include a display area DA and a non-display area NDA. The display area DA may correspond to the sensing area AA of the input sensing layer ISP, and the non-display area NDA may correspond to the non-sensing area BA of the input sensing layer ISP.

The display panel DP may include a pixel PX. The pixel PX may be provided in a plurality, and the pixels PX may be arranged in the display area DA along the first direction DR1 and the second direction DR2.

Figure 4:
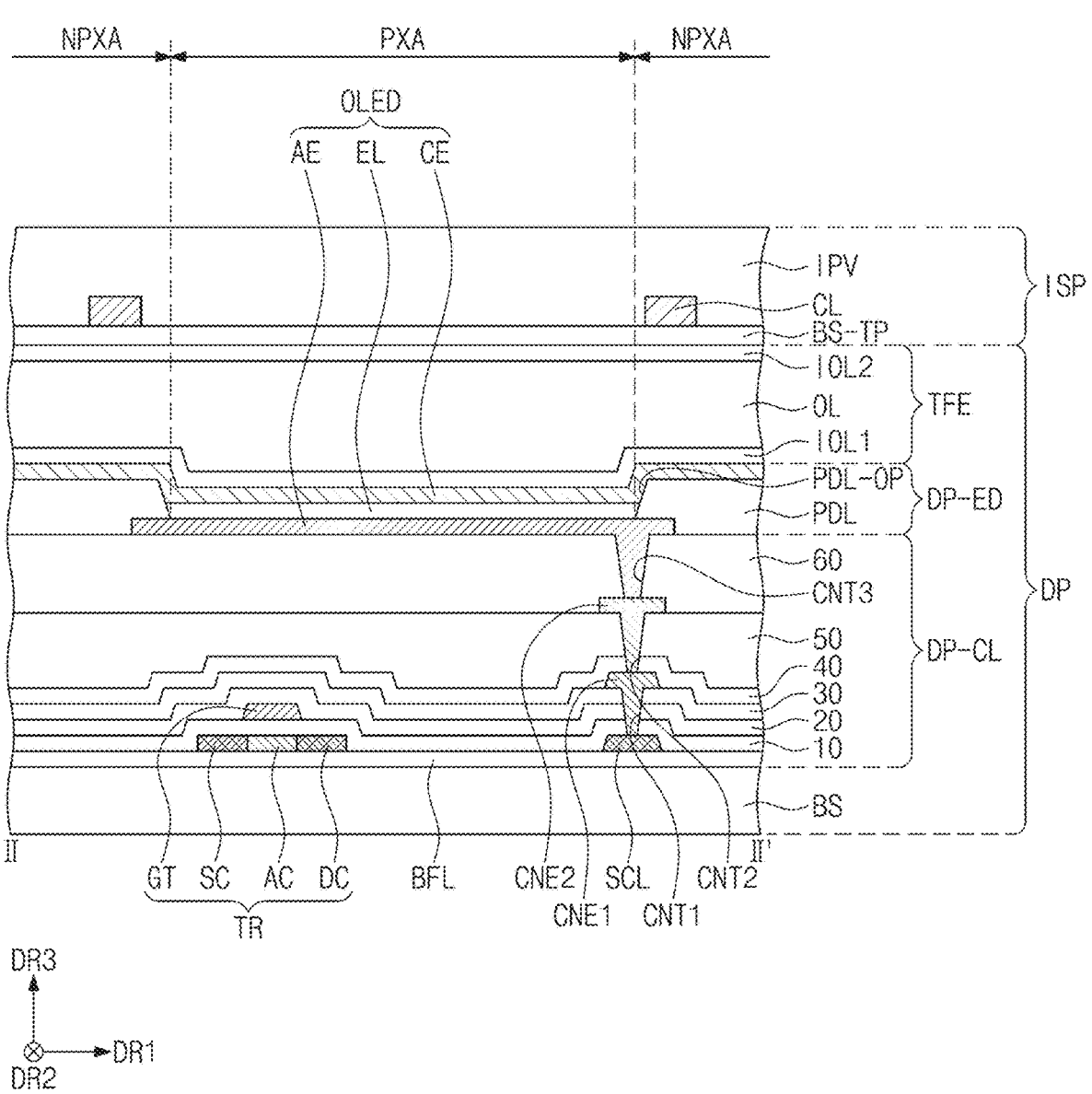
FIG. 4 is a cross-sectional view taken along the line II-II' of FIG. 3.

FIG. 4 is a cross-sectional view taken along the line II-II' of FIG. 3.

Referring to FIG. 4, the display module DM (e.g., refer to FIG. 3) may include the display panel DP and the input sensing layer ISP.

The display panel DP may include the base layer BS, the circuit element layer DP-CL, the display element layer DP-ED, and the encapsulation layer TFE.

At least one inorganic layer may be formed on an upper surface of the base layer BS. The inorganic layer may include at least one of aluminum oxide, titanium oxide, silicon oxide, silicon nitride, silicon oxynitride, zirconium oxide, and/or hafnium oxide. The inorganic layer may be formed in multiple layers. The inorganic layers formed in the multiple layers may form a barrier layer and/or a buffer layer. In the present embodiment, the display panel DP may further include a buffer layer BFL.

The buffer layer BFL may be disposed on the base layer BS. The buffer layer BFL may increase an adhesion between the base layer BS and the semiconductor pattern. The buffer layer BFL may include a silicon oxide layer and a silicon nitride layer. The silicon oxide layer and the silicon nitride layer may be alternately stacked.

The semiconductor pattern may be disposed on the buffer layer BFL. The semiconductor pattern may include poly-silicon, but the present disclosure is not limited thereto or thereby. The semiconductor pattern may include amorphous silicon, a low-temperature polycrystalline silicon, or an oxide semiconductor.

FIG. 4 shows a portion of the semiconductor pattern, and the semiconductor pattern may be further disposed in other areas. The semiconductor pattern may be arranged with a suitable rule (e.g., a specific or predetermined rule) over the plurality of pixels PX. The semiconductor pattern may have different electrical properties depending on whether it is doped or not. The semiconductor pattern may include a high-conductivity region with a high conductivity, and a low-conductivity region with a low conductivity. The high-conductivity region may be doped with an N-type dopant or a P-type dopant. A P-type transistor may include a doped region that is doped with the P-type dopant, and an N-type transistor may include a doped region that is doped with the N-type dopant. The low-conductivity region may be a non-doped region, or may be a region that is doped at a concentration lower than that of the high-conductivity region.

The high-conductivity region may have a conductivity greater than that of the low-conductivity region, and may substantially serve as an electrode or a signal line. The low-conductivity region may substantially correspond to an active (e.g., a channel) of a transistor. In other words, a portion of the semiconductor pattern may be the active of the transistor, another portion of the semiconductor pattern may be a source or a drain of the transistor, and another portion of the semiconductor pattern may be a connection electrode or a connection signal line. FIG. 4 shows one transistor TR, from among transistors, and the light emitting element OLED included in the pixel PX (e.g., refer to FIG. 3).

The transistor TR may include a source area SC, a channel area AC, a drain area DC, and a gate GT. The source area SC, the channel area AC, and the drain area DC of the transistor TR may be formed from the semiconductor pattern. The source area SC and the drain area DC may extend in opposite directions as each other from the channel area AC in a cross-section. FIG. 4 shows a portion of the connection signal line SCL formed from the semiconductor pattern. The connection signal line SCL may be connected to the drain area DC of the transistor TR when viewed in the plane (e.g., in a plan view).

A first insulating layer 10 may be disposed on the buffer layer BFL. The first insulating layer 10 may commonly overlap with the pixels PX, and may cover the semiconductor pattern. The first insulating layer 10 may be an inorganic layer and/or an organic layer, and may have a single-layer or multi-layered structure. The first insulating layer 10 may include at least one of aluminum oxide, titanium oxide, silicon oxide, silicon nitride, silicon oxynitride, zirconium oxide, and/or hafnium oxide. In the present embodiment, the first insulating layer 10 may have a single-layer structure of a silicon oxide layer. In addition to the first insulating layer 10, an insulating layer of the circuit element layer DP-CL described in more detail below may also be an inorganic layer and/or an organic layer, and may have a single-layer or multi-layered structure. The inorganic layer may include at least one of the above-described inorganic materials, but the present disclosure is not limited thereto.

The gate GT of the transistor TR may be disposed on the first insulating layer 10. The gate GT may be a portion of a metal pattern. The gate GT may overlap with the channel area AC. The gate GT may be used as a mask in a process of doping the semiconductor pattern.

A second insulating layer 20 may be disposed on the first insulating layer 10, and may cover the gate GT. The second insulating layer 20 may commonly overlap with the pixels PX. The second insulating layer 20 may be an inorganic layer and/or an organic layer, and may have a single-layer or multi-layered structure. The second insulating layer 20 may include at least one of silicon oxide, silicon nitride, and/or silicon oxynitride. In the present embodiment, the second insulating layer 20 may have a multi-layered structure of a silicon oxide layer and a silicon nitride layer.

A third insulating layer 30 may be disposed on the second insulating layer 20. The third insulating layer 30 may have a single-layer structure or a multi-layered structure. As an example, the third insulating layer 30 may have a multi-layered structure of a silicon oxide layer and a silicon nitride layer.

A first connection electrode CNE1 may be disposed on the third insulating layer 30. The first connection electrode CNE1 may be connected to the connection signal line SCL via a contact hole CNT1 defined through (e.g., penetrating) the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT2 defined through (e.g., penetrating) the fourth insulating layer 40 and the fifth insulating layer 50.

A sixth insulating layer 60 may be disposed on the fifth insulating layer 50, and may cover the second connection electrode CNE2. The sixth insulating layer 60 may be an organic layer.

The display element layer DP-ED may be disposed on the circuit element layer DP-CL. The display element layer DP-ED may include the light emitting element OLED and a pixel definition layer PDL. As an example, the display element layer DP-ED may include an organic light emitting material, a quantum dot, a quantum rod, a micro-LED, or a nano-LED. Hereinafter, the organic light emitting element will be described in more detail as a representative example of the light emitting element OLED, but the present disclosure is not limited thereto.

The light emitting element OLED may include a first electrode AE, a light emitting layer EL, and a second electrode CE. The first electrode AE may be disposed on the sixth insulating layer 60. The first electrode AE may be connected to the second connection electrode CNE2 via a contact hole CNT3 defined through (e.g., penetrating) the sixth insulating layer 60.

The pixel definition layer PDL may be disposed on the sixth insulating layer 60, and may cover a portion of the first electrode AE. A pixel opening PDL-OP may be defined through (e.g., may penetrate) the pixel definition layer PDL. At least a portion of the first electrode AE may be exposed through the pixel opening PDL-OP of the pixel definition layer PDL.

According to the display panel DP, light emitting areas PXA may be distinguished from each other by the pixel definition layer PDL. The display panel DP may include the light emitting areas PXA and a non-light-emitting area NPXA, and the non-light-emitting area NPXA may overlap with the pixel definition layer PDL. A portion corresponding to the first electrode AE exposed through the pixel opening PX-OP may be defined as the light emitting area PXA.

The light emitting layer EL may be disposed on the first electrode AE. The light emitting layer EL may be disposed in an area corresponding to the pixel opening PDL-OP. In other words, the light emitting layer EL may be formed in each of the pixels PX after being divided into a plurality of portions. In the case where the light emitting layer EL is formed in each of the pixels PX after being divided into a plurality of portions, each of the light emitting layers EL may emit light having at least one of a blue color, a red color, or a green color, but the present disclosure is not limited thereto or thereby. The light emitting layers EL may be commonly provided in the pixels PX without being divided into the plurality of portions. In this case, the light emitting layer EL may provide a blue light or a white light.

The second electrode CE may be disposed on the light emitting layer EL. The second electrode CE may have a single unitary form, and may be commonly disposed over the pixels PX. The second electrode CE may function as a conductor in a storage battery together with a conductive layer CL, which will be described in more detail below with reference to FIGS. 9 and 10.

The encapsulation layer TFE may be disposed on the display element layer DP-ED. The encapsulation layer TFE may include a first inorganic layer IOL1, an organic layer OL, and a second inorganic layer IOL2, which are sequentially stacked. However, the layers of the encapsulation layer TFE are not limited thereto or thereby.

The inorganic layers IOL1 and IOL2 may protect the display element layer DP-ED from moisture and oxygen. The organic layer may protect the display element layer DP-ED from a foreign substance, such as dust particles. The inorganic layers IOL1 and IOL2 may include at least one of silicon nitride, silicon oxynitride, silicon oxide, titanium oxide, and/or aluminum oxide. The organic layer OL may include an acrylic-based organic layer, but the present disclosure is not limited thereto or thereby.

The input sensing layer ISP may be disposed on the display panel DP. The input sensing layer ISP may be referred to as a sensor layer. The input sensing layer ISP may include a sensing base layer BS-TP, the conductive layer CL, and a sensing insulating layer IPV. In the present disclosure, the sensing base layer BS-TP may be referred to as a first sensing insulating layer, and the sensing insulating layer IPV may be referred to as a second sensing insulating layer.

The sensing base layer BS-TP may be disposed directly on the display panel DP. The sensing base layer BS-TP may be an inorganic layer that includes at least one of silicon nitride, silicon oxynitride, and/or silicon oxide. As another example, the sensing base layer BS-TP may be an organic layer that includes an epoxy-based resin, an acrylic-based resin, or an imide-based resin. The sensing base layer BS-TP may have a single-layer structure, or a multi-layered structure of a plurality of layers that are stacked one on another in the third direction DR3.

The conductive layer CL may have a single-layer structure, or a multi-layered structure of a plurality of layers that are stacked one on another in the third direction DR3.

The conductive layer CL having the single-layer structure may include a metal layer or a transparent conductive layer. The metal layer may include molybdenum, silver, titanium, copper, aluminum, or a suitable alloy thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include a conductive polymer such as PEDOT, a metal nanowire, graphene, or the like.

The conductive layer having the multi-layered structure may include a plurality of metal layers. The metal layers may have, for example, a three-layered structure of titanium/aluminum/titanium. The conductive layer having the multi-layered structure may include at least one metal layer and at least one transparent conductive layer.

The sensing insulating layer IPV may be disposed on the conductive layer CL. The sensing insulating layer IPV may include an inorganic layer. The inorganic layer may include at least one of aluminum oxide, titanium oxide, silicon oxide, silicon nitride, silicon oxynitride, zirconium oxide, and/or hafnium oxide.

As another example, the sensing insulating layer IPV may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

In some embodiments, the input sensing layer ISP may further include an additional conductive layer disposed on the conductive layer CL. When the input sensing layer ISP further includes the additional conductive layer, the sensing insulating layer IPV may be disposed between the conductive layer CL and the additional conductive layer.

Figure 5:
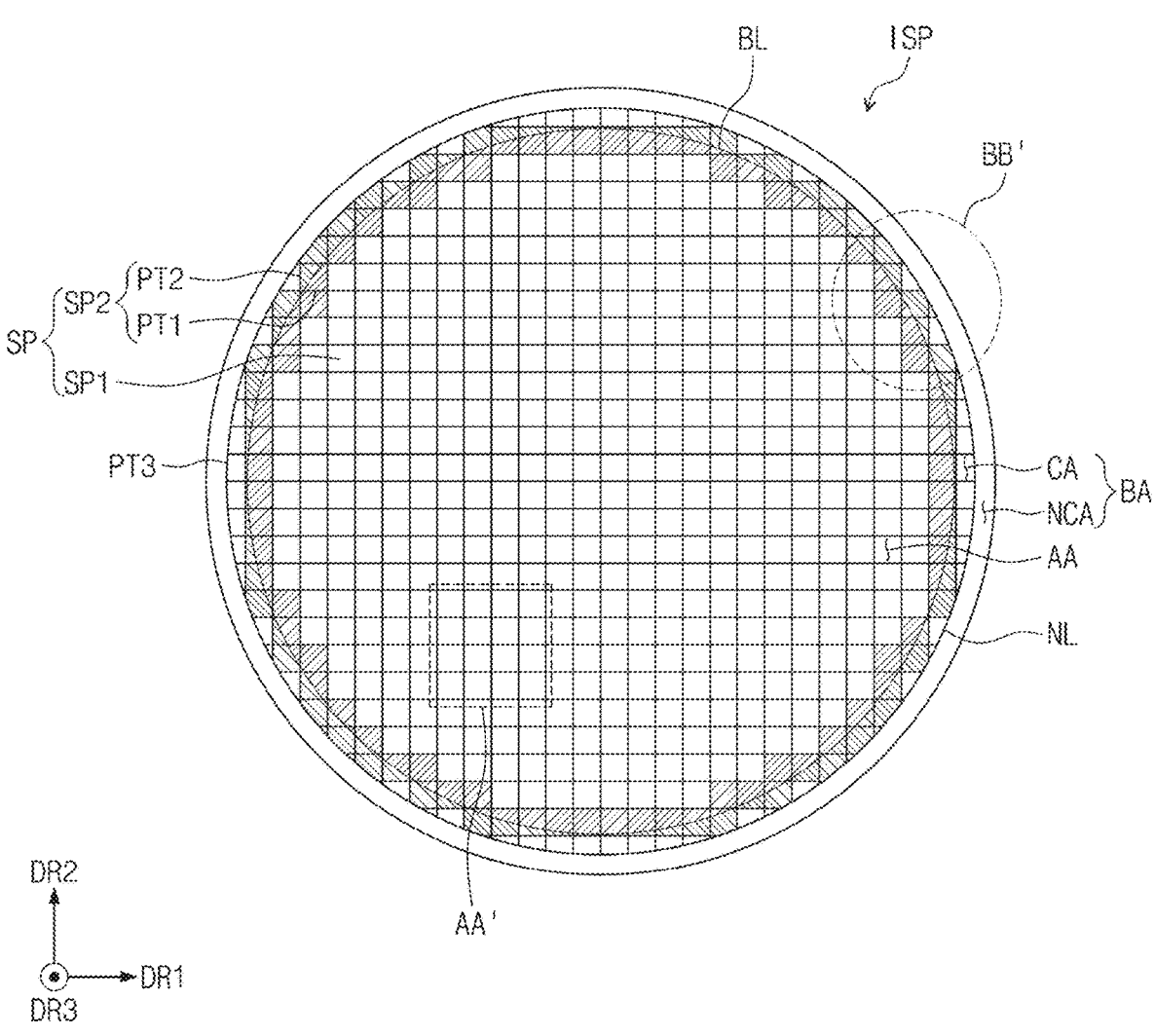
FIG. 5 is a plan view of an input sensing layer according to an embodiment of the present disclosure.
Figure 6:
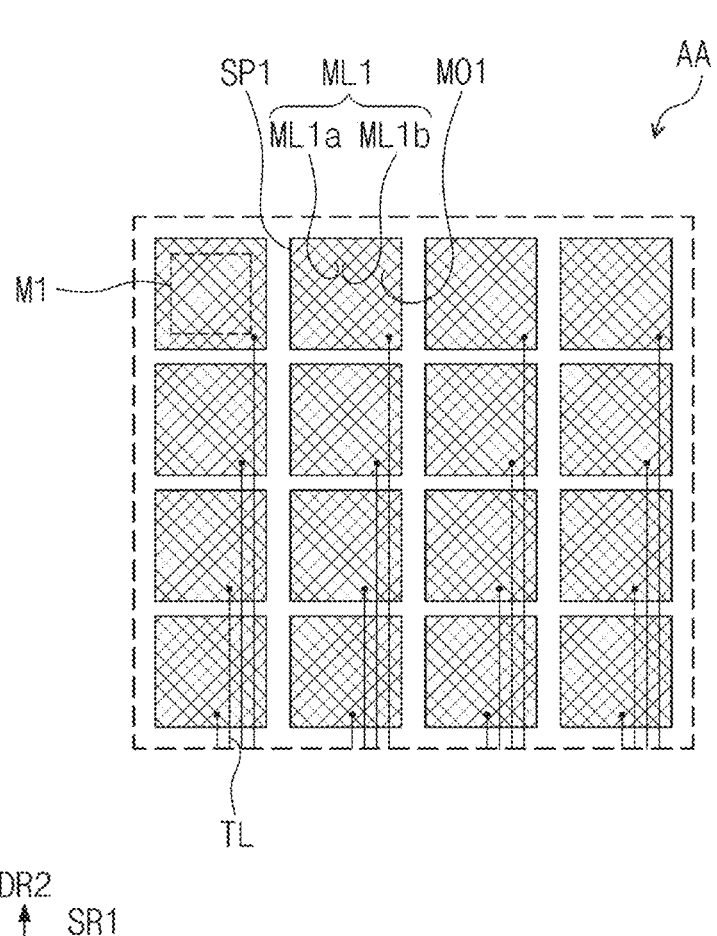
FIG. 6 is an enlarged plan view of the area AA' of FIG. 5.
Figure 6:
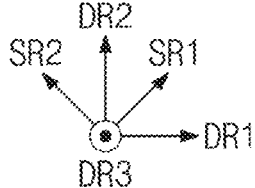
Figure 7:
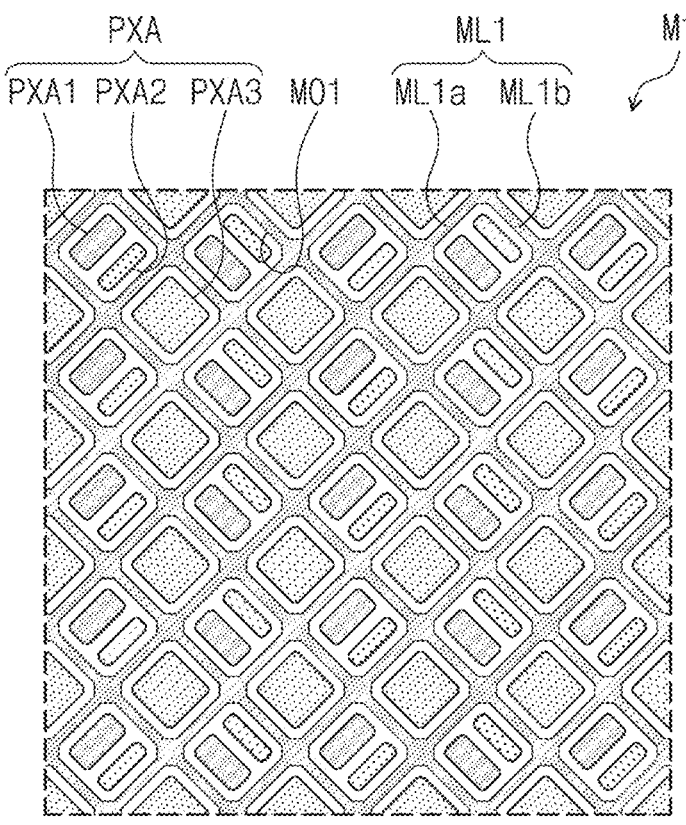
FIG. 7 is an enlarged plan view of the area M1 of FIG. 6.
Figure 7:
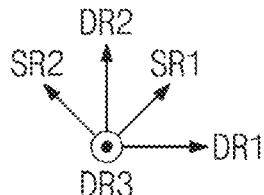

FIG. 5 is a plan view of the input sensing layer ISP according to an embodiment of the present disclosure. FIG. 6 is an enlarged plan view of the area AA' of FIG. 5. FIG. 7 is an enlarged plan view of the area M1 of FIG. 6.

Hereinafter, an arrangement and a shape of sensing electrodes will be described in more detail with reference to FIGS. 5 to 7.

The input sensing layer ISP may include the sensing area AA, and the non-sensing area BA adjacent to the sensing area AA. The non-sensing area BA may include a first area CA, and a second area NCA adjacent to the first area CA.

The first area CA may surround (e.g., around a periphery of) the sensing area AA, and the second area NCA may surround (e.g., around a periphery of) the first area CA. Accordingly, the sensing area AA may be spaced apart from the second area NCA, with the first area CA interposed therebetween.

The input sensing layer ISP may include a plurality of sensing electrodes SP and a plurality of trace lines TL. The sensing electrodes SP and the trace lines TL may be included in the conductive layer CL described above with reference to FIG. 4.

For convenience of illustration, in FIG. 5, a first conductive line ML1 (e.g., refer to FIG. 6) and a second conductive line ML2 (e.g., refer to FIG. 9) included in the sensing electrodes SP are not shown, and an outer shape of the sensing electrodes SP is schematically shown.

The sensing electrodes SP may include first sensing electrodes SP1 overlapping with the sensing area AA, and second sensing electrodes SP2 overlapping with the non-sensing area BA. In FIG. 5, for convenience of illustration, the second sensing electrodes SP2 are shown by hatchings to distinguish the second sensing electrodes SP2 from the first sensing electrodes SP1.

Each of the first sensing electrodes SP1 may have a polygonal shape when viewed in the plane (e.g., in a plan view). In the present embodiment, each of the first sensing electrodes SP1 may have a rectangular shape.

The first sensing electrodes SP1 may be arranged in the sensing area AA along the first direction DR1 and the second direction DR2. The second sensing electrodes SP2 may be arranged along the area boundary BL. A portion of each of the second sensing electrodes SP2 may overlap with the area boundary BL when viewed in the plane (e.g., in a plan view).

In the present embodiment, some of the second sensing electrodes SP2 may have a shape different from that of the first sensing electrodes SP1. As an example, at least some of the second sensing electrodes SP2 may have a shape obtained by cutting-out a portion from the first sensing electrodes SP1. Some of the second sensing electrodes SP2 may have a shape obtained by cutting-out a portion of a quadrangular shape of the first sensing electrodes SP1 along an outer boundary NL between the first area CA and the second area NCA.

However, the present disclosure is not limited thereto or thereby, and the first sensing electrodes SP1 and the second sensing electrodes SP2 may have the same or substantially the same shape as each other. As an example, the first sensing electrodes SP1 and the second sensing electrodes SP2 may have the same or substantially the same quadrangular shape as each other.

Each of the second sensing electrodes SP2 may include a first portion PT1 disposed in the sensing area AA, and a second portion PT2 connected to the first portion PT1 and overlapping with the non-sensing area BA.

The first portion PT1 and the second portion PT2 may be distinguished from each other by the area boundary BL. A portion of the second sensing electrode SP2, which is disposed in the sensing area AA with respect to the area boundary BL, may be defined as the first portion PT1. A portion of the second sensing electrode SP2, which is disposed in the first area CA with respect to the area boundary BL, may be defined as the second portion PT2. In FIG. 5, for convenience of illustration, the first portion PT1 and the second portion PT2 of each of the second sensing electrodes SP2 are shown by different hatchings from each other.

In the present embodiment, the input sensing layer ISP may be a self-capacitance kind of touch sensor.

Referring to FIG. 6, the first sensing electrodes SP1 may include the first conductive line ML1.

The first conductive line ML1 may include first mesh lines ML1*a* extending in a first diagonal direction SR1, and second mesh lines ML1*b* extending in a second diagonal direction SR2 crossing or intersecting the first diagonal direction SR1.

In the first sensing electrode SP1, the first mesh lines ML1*a* may be arranged to be spaced apart from each other along the second diagonal direction SR2, and the second mesh lines ML1*b* may be arranged to be spaced apart from each other along the first diagonal direction SR1.

The first mesh lines ML1*a* crossing or intersecting the second mesh lines ML1*b* may define first mesh openings MO1. The first mesh openings MO1 will be described in more detail below with reference to FIG. 7.

Each of the trace lines TL may be connected to a corresponding one of the first sensing electrodes SP1 in the sensing area AA. One ends of the trace lines TL may be connected to the first sensing electrodes SP1, respectively.

The trace lines TL may extend in the second direction DR2.

The display module DM may further include an integrated circuit disposed at one side of the input sensing layer ISP (e.g., refer to FIG. 2). As an example, the integrated circuit may be a driving circuit.

Other ends (e.g., opposite ends) of the trace lines TL may be connected to the integrated circuit.

In other words, one ends of the trace lines TL may be connected to the first sensing electrodes SP1, and the other ends of the trace lines TL may be connected to the integrated circuit. The trace lines TL may transmit electrical signals between the first sensing electrodes SP1 and the integrated circuit.

Because the input sensing layer ISP (e.g., refer to FIG. 2) may be the self-capacitance kind of touch sensor according to some embodiments, the trace line TL may extend within the sensing area AA, and may be connected to the integrated circuit without extending from the non-sensing area BA and without bypassing the sensing area AA. FIG. 6 shows the structure in which the trace line TL extends in the second direction DR2 in the sensing area AA as a representative example. However, the present disclosure is not limited thereto or thereby, and the trace lines TL may extend in the second direction DR2 between the first sensing electrodes SP1 and may be connected to the integrated circuit.

Referring to FIG. 7, the light emitting area PXA may include a first light emitting area PXA1 for displaying a red color and having a bar shape, a second light emitting area PXA2 for displaying a green color and having a bar shape, and a third light emitting area PXA3 for displaying a blue color and having a lozenge shape.

In the present embodiment, sizes of the first, second, and third light emitting areas may be increased in an order of the second light emitting area PXA2, the first light emitting area PXA1, and the third light emitting area PXA3.

The first light emitting area PXA1 and the second light emitting area PXA2 may extend in the first diagonal direction SR1, or may extend in the second diagonal direction SR2.

The light emitting area PXA may overlap with each of the first mesh openings MO1. Light provided from the light emitting area PXA may travel to the outside through the first mesh openings MO1. Accordingly, even though the input sensing layer ISP (e.g., refer to FIG. 4) is disposed on the display element layer DP-ED, the light provided through the light emitting area PXA may not be blocked by the input sensing layer ISP.

However, the arrangement of the light emitting areas shown in FIG. 7 is provided as a representative example, and the present disclosure is not particularly limited thereto or thereby.

Figure 8:
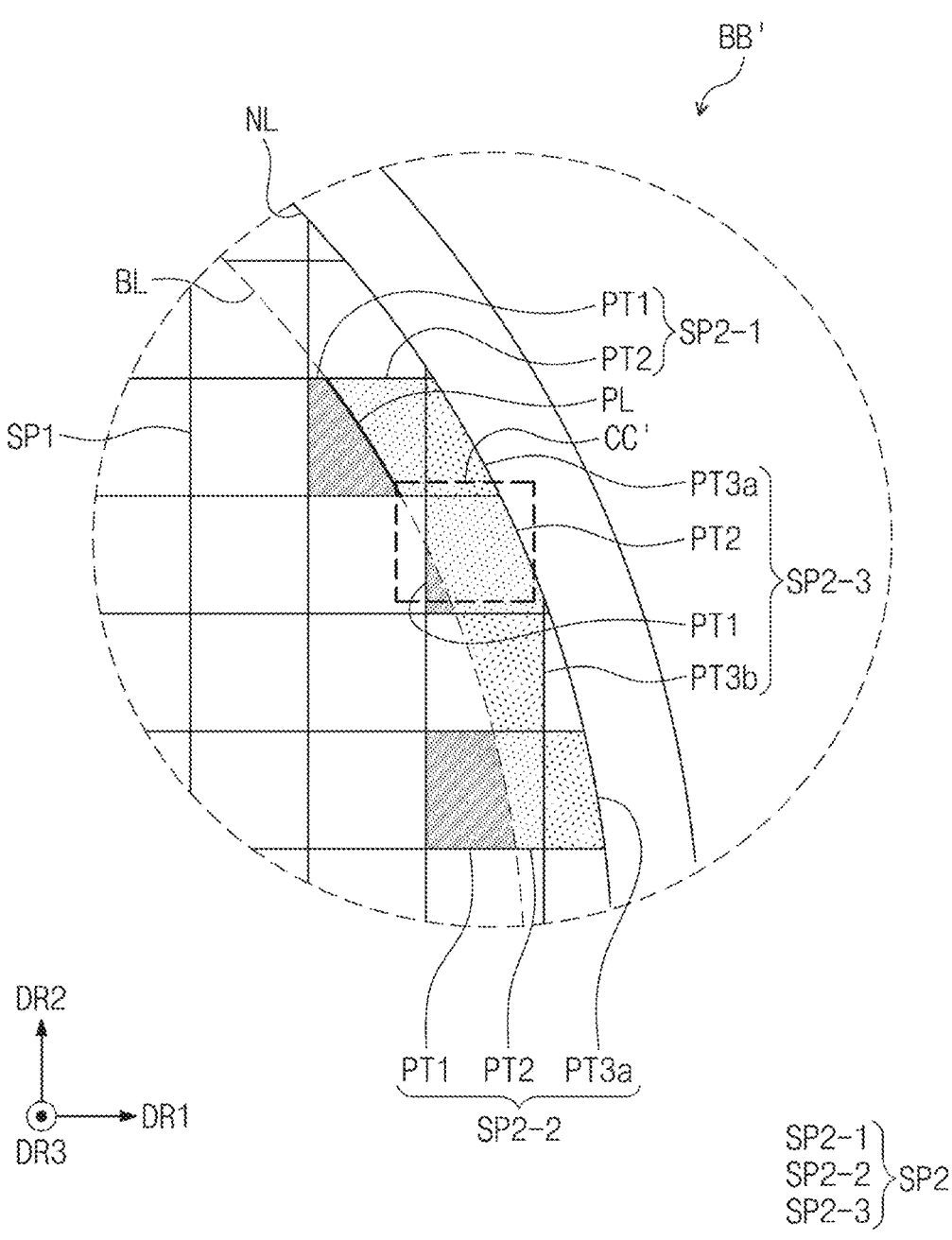
FIG. 8 is an enlarged plan view of the area BB' of FIG. 5.

FIG. 8 is an enlarged plan view of the area BB' of FIG. 5.

Hereinafter, a structure in which the second sensing electrode SP2 secures a capacitance will be described in more detail with reference to FIG. 8.

An input sensing layer having an irregular shape according to a comparative example (e.g., a comparative input sensing layer) may have a shape in which a second sensing electrode is cut along an area boundary.

In other words, the second sensing electrode of the comparative input sensing layer includes a first portion, and does not include a second portion. Accordingly, the second sensing electrode of the comparative input sensing layer has a size smaller than that of a first sensing electrode of the comparative input sensing layer when viewed in the plane (e.g., in a plan view), and there may be a difference in capacitance between the sensing electrodes. Due to the difference in capacitance between the sensing electrodes, a touch sensitivity may be decreased in an outer portion of the display device including the comparative input sensing layer.

According to some embodiments of the present disclosure, the second sensing electrode SP2 may include the first portion PT1 disposed in the sensing area AA, as well as the second portion PT2 disposed in the non-sensing area BA, and thus, the decrease of the touch sensitivity in the outer portion of the display device DD (e.g., refer to FIG. 1) may be prevented or substantially prevented.

According to a mutual-capacitance kind of input sensing layer, the trace line that connects the sensing electrode and the driving circuit to each other may be placed in the non-sensing area BA. However, because the trace line TL (e.g., refer to FIG. 6) overlaps with the sensing area AA and is not disposed in the non-sensing area BA, the second sensing electrode SP2 may be expanded to the non-sensing area BA in which the trace line TL is not disposed.

According to some embodiments of the present disclosure, the size of the second sensing electrode SP2 may be expanded when viewed in the plane (e.g., in a plan view), and thus, an insufficient capacitance that may be caused by the cut shape of the first portion PT1 may be compensated for (e.g., may be prevented or substantially prevented).

Accordingly, the capacitance of the second sensing electrode SP2 may be the same or substantially the same as (or similar to) the capacitance of the first sensing electrode SP1.

As used in the present disclosure, the expression the "capacitance of the second sensing electrode SP2 is the same or substantially the same as (or similar to) the capacitance of the first sensing electrode SP1" may include the capacitance of the second sensing electrode SP2 that is about equal to or greater than 0.9 times, and about equal to or smaller than 1.1 times of the capacitance of the first sensing electrode SP1. However, the present disclosure is not limited thereto or thereby, as long as the difference in the touch sensitivity between the first sensing electrode SP1 and the second sensing electrode SP2 is decreased (e.g., such that it is imperceptible to the user).

As described above, because the first sensing electrode SP1 and the second sensing electrode SP2 may have the same or substantially the same (or similar) capacitance as each other, the decrease of the touch sensitivity in the outer portion of the display device DD (e.g., refer to FIG. 1) may be prevented or substantially prevented.

In the present embodiment, the area boundary BL may have a circular shape, and an electrode boundary PL between the first portion PT1 and the second portion PT2, which overlaps with the area boundary BL, may have a curved-line shape along the circular shape of the area boundary BL.

As shown in FIG. 8, electrodes with different shapes from each other from among the electrodes included in the second sensing electrodes SP2 are classified into second-first, second-second, and second-third sensing electrodes SP2-1, SP2-2, and SP2-3.

The second-first sensing electrode SP2-1 may include a first portion PT1 and a second portion PT2. Referring to FIG. 8, a sum of the size of the first portion PT1 and the size of the second portion PT2 may be the same or substantially the same as (or similar to) a size of the first sensing electrode SP1. Accordingly, the second-first sensing electrode SP2-1 may have the same or substantially the same (or similar) capacitance as that of the first sensing electrode SP1.

The second-second sensing electrode SP2-2 may include a first portion PT1 and a second portion PT2. In a case where at least one of the first portion PT1 and/or the second portion PT2 has a lower electrode density than that of the first sensing electrode SP1, the capacitance of the first sensing electrode SP1 and the capacitance of the second-first sensing electrode SP2-1 may not be the same or similar to each other, even though the first sensing electrode SP1 and the second-first sensing electrode SP2-1 have the same or substantially the same (or similar) planar size. In this case, the second-second sensing electrode SP2-2 may further include a third portion PT3a connected to the second portion PT2. In other words, the second-second sensing electrode SP2-2 may further include the third portion PT3a connected to the second portion PT2 to compensate for an insufficient capacitance.

The first, second, and third portions PT1, PT2, and PT3a included in the second-second sensing electrode SP2-2 may be connected to each other, and may be provided integrally with each other. Accordingly, the first portion PT1, the second portion PT2, and the third portion PT3a included in the second-second sensing electrode SP2-2 may serve as a conductor for a single sensing electrode.

The second-third sensing electrode SP2-3 may include a first portion PT1 and a second portion PT2. However, the second portion PT2 included in the second-third sensing electrode SP2-3 may have a shape that is cut along the outer boundary NL. Therefore, the second-third sensing electrode SP2-3 may further include a third-first portion PT3a and a third-second portion PT3b, which are adjacent to the second portion PT2. Accordingly, the second-third sensing electrode SP2-3 may compensate for the insufficient capacitance caused by the cut shape of the second portion PT2.

FIG. 8 shows a structure in which the second-third sensing electrode SP2-3 includes two third portions PT3a and PT3b as a representative example, however, the number of third portions included in the sensing electrode is not particularly limited thereto or thereby.

Figure 9:
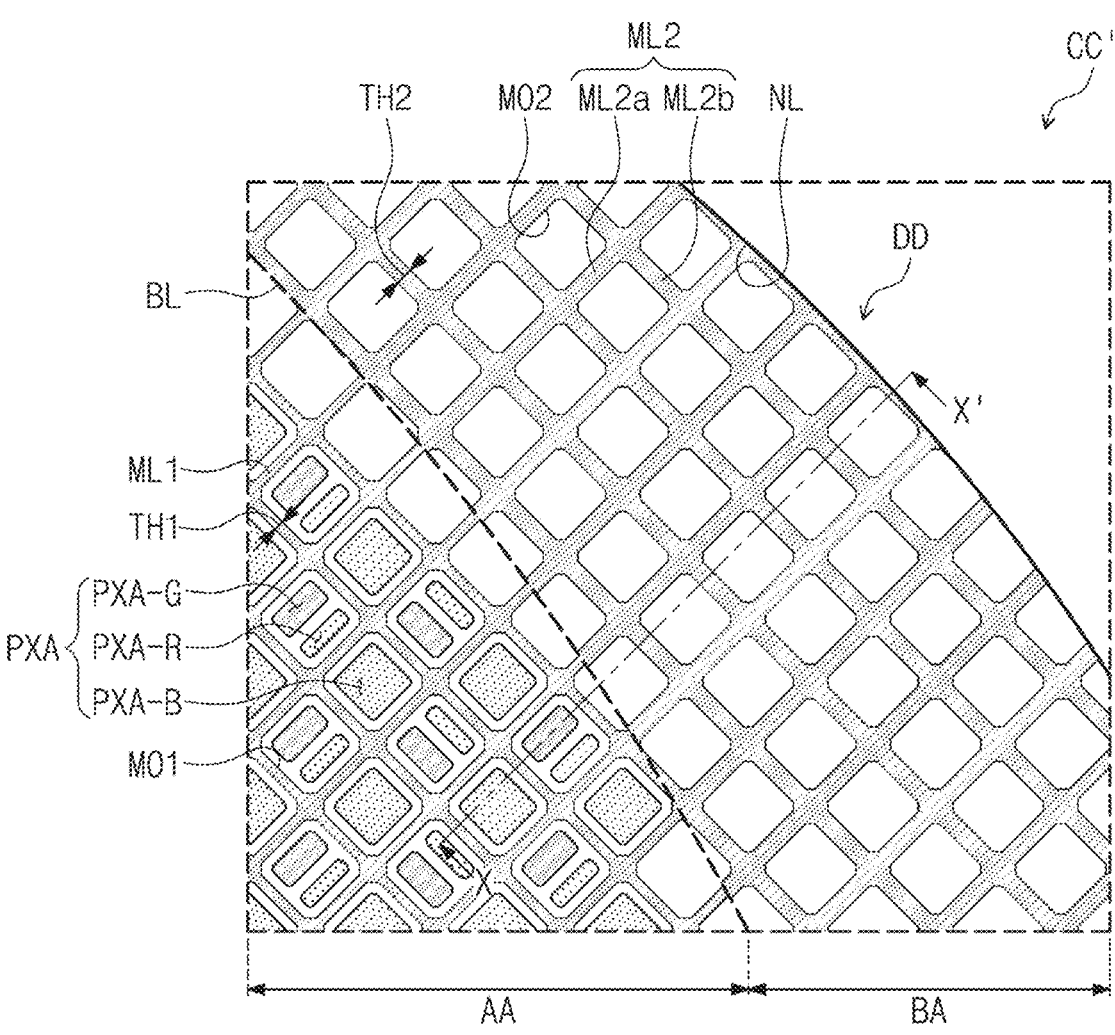
FIG. 9 is an enlarged plan view of a portion of an input sensing layer according to an embodiment of the present disclosure.
Figure 9:
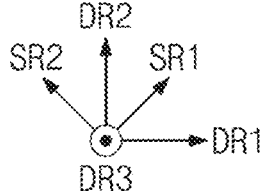

FIG. 9 is an enlarged plan view of a portion of an input sensing layer according to an embodiment of the present disclosure. For example, FIG. 9 is an enlarged plan view of the area CC' of FIG. 8.

Hereinafter, a method of controlling the capacitance by adjusting a second thickness TH2 of the second conductive line of the second-second sensing electrode SP2-2 will be described in more detail with reference to FIG. 9. Descriptions of the second-second sensing electrode SP2-2 with reference to FIG. 9 may be applied to the second sensing electrodes SP2-1 and SP2-2 described above with reference to FIG. 8.

The second portions PT2 may include the second conductive line ML2.

The second conductive line ML2 may include first mesh lines ML2a extending in the first diagonal direction SR1, and second mesh lines ML2b extending in the second diagonal direction SR2 crossing or intersecting the first diagonal direction SR1. In the present disclosure, the first mesh lines ML2a and the second mesh lines ML2b of the second conductive line ML2 may be referred to as third mesh lines and fourth mesh lines, respectively.

However, the first mesh lines ML2a and the second mesh lines ML2b are illustrated separately from each other for convenience of illustration, and each of the second portions PT2 may have a continuous shape without being disconnected in an area overlapping with the non-sensing area BA.

The first mesh lines ML2a and the second mesh lines ML2b crossing or intersecting the first mesh lines ML2a may define second mesh openings MO2.

Different from the first mesh opening MO1, the second mesh opening MO2 may not overlap with the light emitting area PXA. In other words, although a size of the second mesh opening MO2 when viewed in the plane (e.g., in a plan view) may be decreased, the blocking of the light emitted from the light emitting area PXA may not occur.

Because a capacitance may be proportional to a planar size of a conductor, the capacitance of the sensing electrodes SP1 and SP2 may be proportional to a planar size of the sensing electrodes SP1 and SP2 when viewed in the plane (e.g., in a plan view).

In other words, when a planar size of a metal electrode of the first sensing electrode SP1 (e.g., refer to FIG. 5) is designed to be the same or substantially the same as (or similar to) a planar size of a metal electrode of the second sensing electrode SP2, the difference in the capacitance between the first sensing electrode SP1 and the second sensing electrode SP2 may be reduced.

In the present embodiment, the second thickness TH2 of the second conductive line ML2 may be different from a first thickness TH1 of the first conductive line ML1.

As used in the present disclosure, the thicknesses TH1 and TH2 of the conductive lines ML1 and ML2 may be referred to as a line width.

Because the light emitting area PXA overlaps with the first mesh opening MO1 in the first portion PT1, it may be more difficult to adjust the thickness TH1 of the first conductive line ML1.

However, because the second mesh opening MO2 does not overlap with the light emitting area PXA, the light provided by the light emitting element OLED (e.g., refer to FIG. 4) may not be blocked, even though the thickness of the second conductive line ML2 is increased.

Therefore, the planar size of the second portion PT2 when viewed in the plane (e.g., in a plan view) may be increased by designing the second thickness TH2 of the second conductive line to be larger than the first thickness TH1 of the first conductive line. Accordingly, the planar size of the second sensing electrode SP2 including the second mesh lines ML2 when viewed in the plane (e.g., in a plan view) may be designed to be the same or substantially the same as (or similar to) the planar size of the first sensing electrode SP1 when viewed in the plane, and the capacitance of the second sensing electrode SP2 may be the same or substantially the same as (or similar to) the capacitance of the first sensing electrode SP1.

Figure 10:
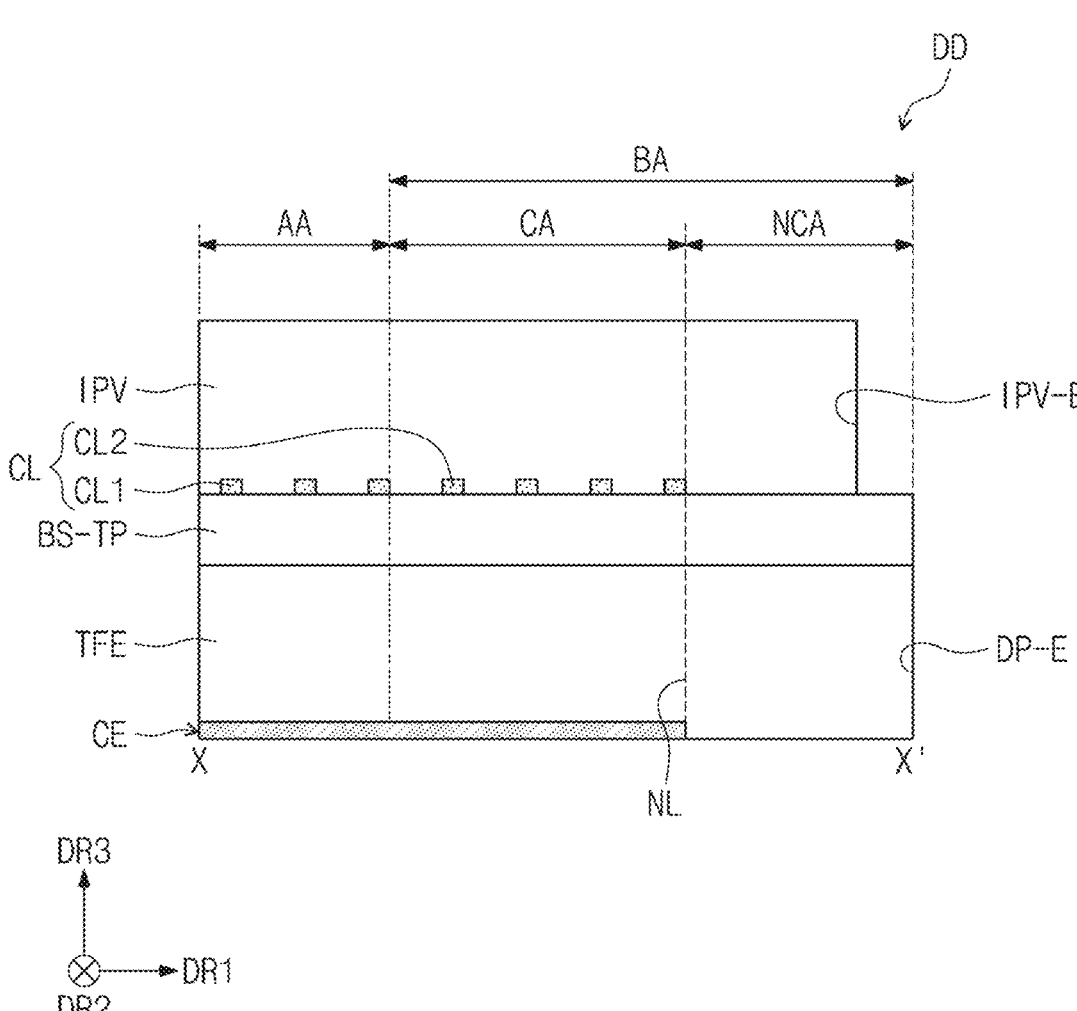
FIG. 10 is a cross-sectional view of a display device according to an embodiment of the present disclosure.

FIG. 10 is a cross-sectional view of the display device DD according to an embodiment of the present disclosure.

FIG. 10 is a cross-sectional view showing a portion of the display device taken along the line X-X' of FIG. 9. For convenience of illustration, some of the components of the display panel DP (e.g., refer to FIG. 4), except for the encapsulation layer TFE and the second electrode CE, are not shown in FIG. 10.

Referring to FIG. 10, the second electrode CE may overlap with the sensing area AA and the non-sensing area BA. In other words, the second electrode CE may overlap with at least a portion of the non-sensing area BA.

The second electrode CE that is provided as a common electrode in a manufacturing process of the display device DD may be expanded to the outside of the sensing area AA.

An area of the non-sensing area BA, which overlaps with the second electrode CE, may be defined as the first area CA.

An area of the non-sensing area BA, which does not overlap with the second electrode CE, may be defined as the second area NCA.

A portion of the conductive layer CL, which is disposed in the sensing area AA, may be defined as a first conductive portion CL1. A portion of the conductive layer CL, which is disposed in the non-sensing area BA, may be defined as a second conductive portion CL2. However, the first conductive portion CL1 and the second conductive portion CL2 may be distinguished from each other for convenience of illustration, and the first conductive portion CL1 and the second conductive portion CL2 may be a single layer formed through a single process.

The first conductive portion CL1 may form the first mesh line ML1 (e.g., refer to FIG. 9) included in the first portion PT1 (e.g., refer to FIG. 5). The second conductive portion CL2 may form the second mesh line ML2 (e.g., refer to FIG. 9) included in the second portion PT2 (e.g., refer to FIG. 5) or the third portion PT3.

The first conductive portion CL1 and the second conductive portion CL2 may overlap with the second electrode CE. Accordingly, the first conductive portion CL1 and the second conductive portion CL2 may be arranged to be spaced apart from the second electrode CE. In other words, the first conductive portion CL1 and the second conductive portion CL2 may be arranged to be spaced apart from each other with the sensing base layer BS-TP and the encapsulation layer TFE interposed therebetween.

The second sensing insulating layer IPV may cover the conductive layer CL.

An edge IPV-E of the second sensing insulating layer may be spaced apart from an edge DP-E of the display panel. The edge IPV-E of the second sensing insulating layer IPV may be disposed inside the edge DP-E of the display panel in the display device DD, however, the present disclosure is not limited thereto or thereby. As an example, in a case where the second sensing insulating layer is formed of an inorganic layer, the edge DP-E of the display panel may be aligned with the edge IPV-E of the second sensing insulating layer.

Figure 11:
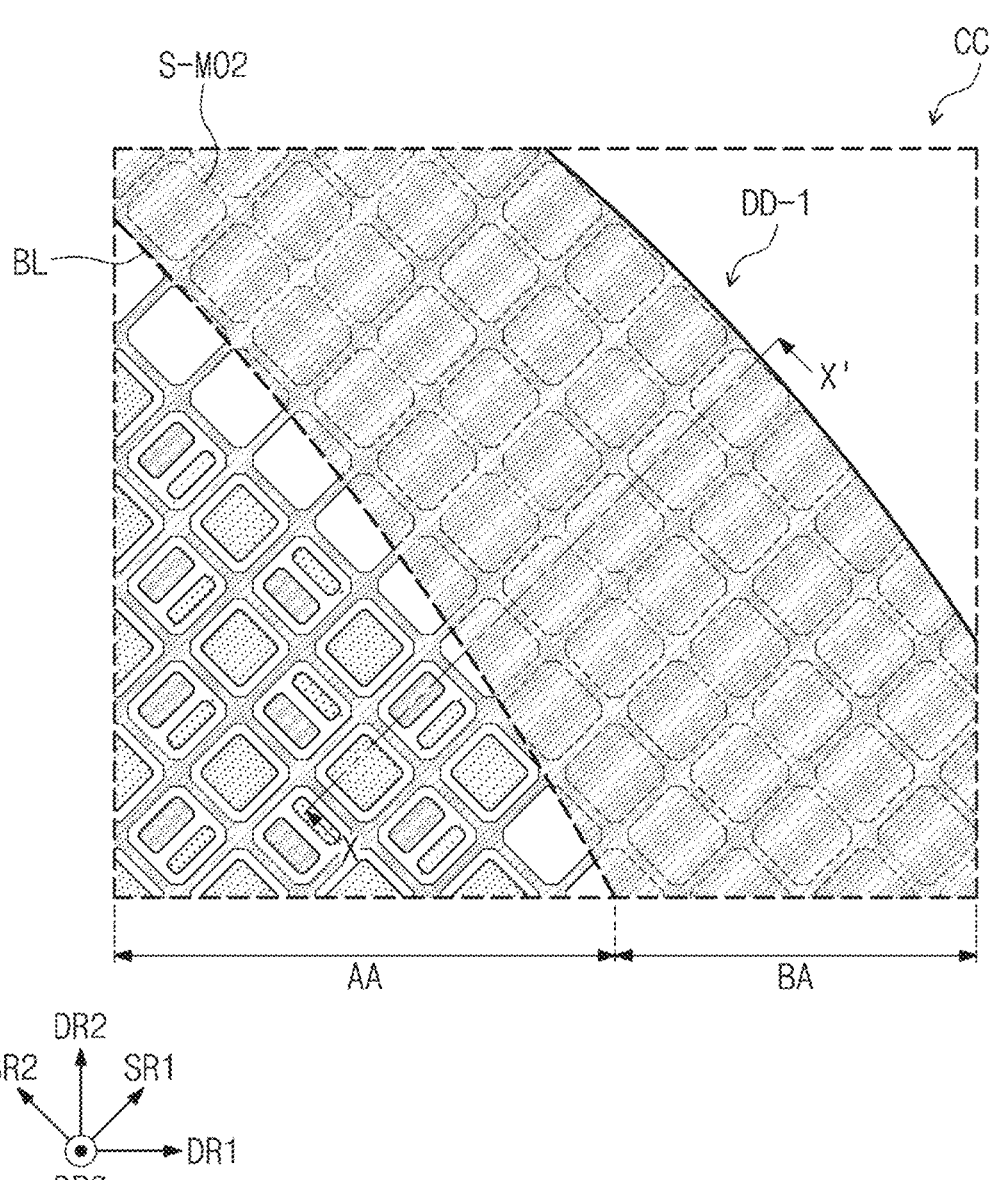
FIG. 11 is a plan view of a portion of a display device according to an embodiment of the present disclosure.
Figure 12:
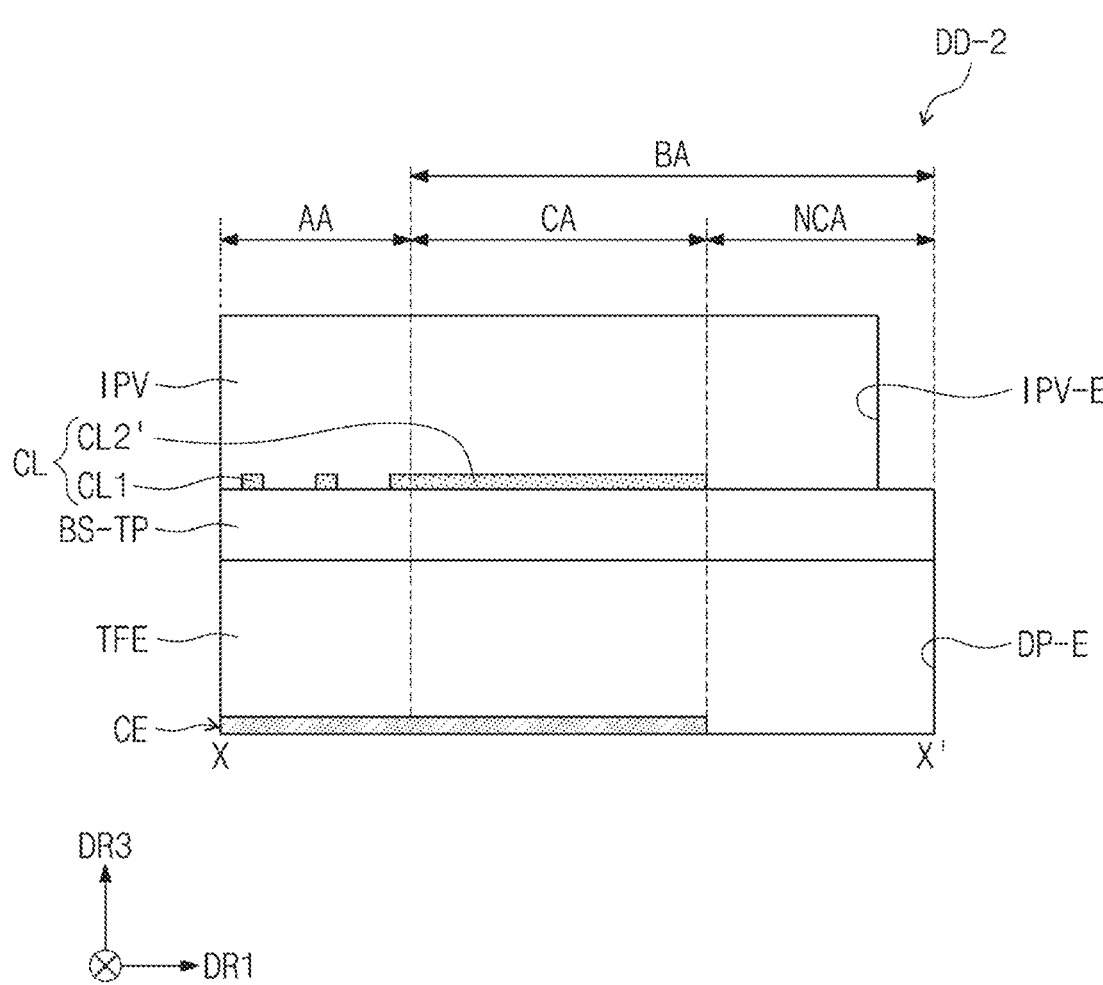
FIG. 12 is a cross-sectional view of a portion of the display device taken along the line X-X' of FIG. 11.

FIG. 11 is a plan view of a portion of a display device according to an embodiment of the present disclosure. FIG. 12 is a cross-sectional view of a portion of the display device taken along the line X-X' of FIG. 11.

FIG. 11 shows a portion of the display device, which corresponds to the area CC' shown in FIG. 8. In FIG. 11, the same or similar reference numerals denote the same or similar elements described above with reference to FIGS. 1 to 10, and thus, redundant description thereof may not be repeated.

Referring to FIGS. 11 and 12, a second conductive portion CL2' included in one second sensing electrode SP2 may be provided as a single continuous portion in the first area CA included in the non-sensing area BA. The second conductive portion CL2' may have a continuous shape in the first area CA.

Accordingly, an element corresponding to the second mesh opening MO2 (e.g., refer to FIG. 9) may not be formed in the second conductive portion CL2' within an area overlapping with the non-sensing area BA. Because the second conductive portion CL2' may not overlap with the light emitting area PXA (e.g., refer to FIG. 7), the light provided by the light emitting area PXA (e.g., refer to FIG. 9) may not be blocked, even though the second mesh opening MO2 may not be formed in the second conductive portion CL2'.

In FIG. 11, a filling location S-MO2 is indicated as a dotted square. The filling location S-MO2 may correspond to a location of the second mesh opening MO2 described above with reference to FIG. 9.

In the present embodiment, because the filling location S-MO2 in the second conductive portion CL2' is filled with the same material as that of the second sensing electrode SP2 (e.g., refer to FIG. 9), the second sensing electrode SP2 according to the present embodiment may secure a sufficient capacitance.

Figure 13:
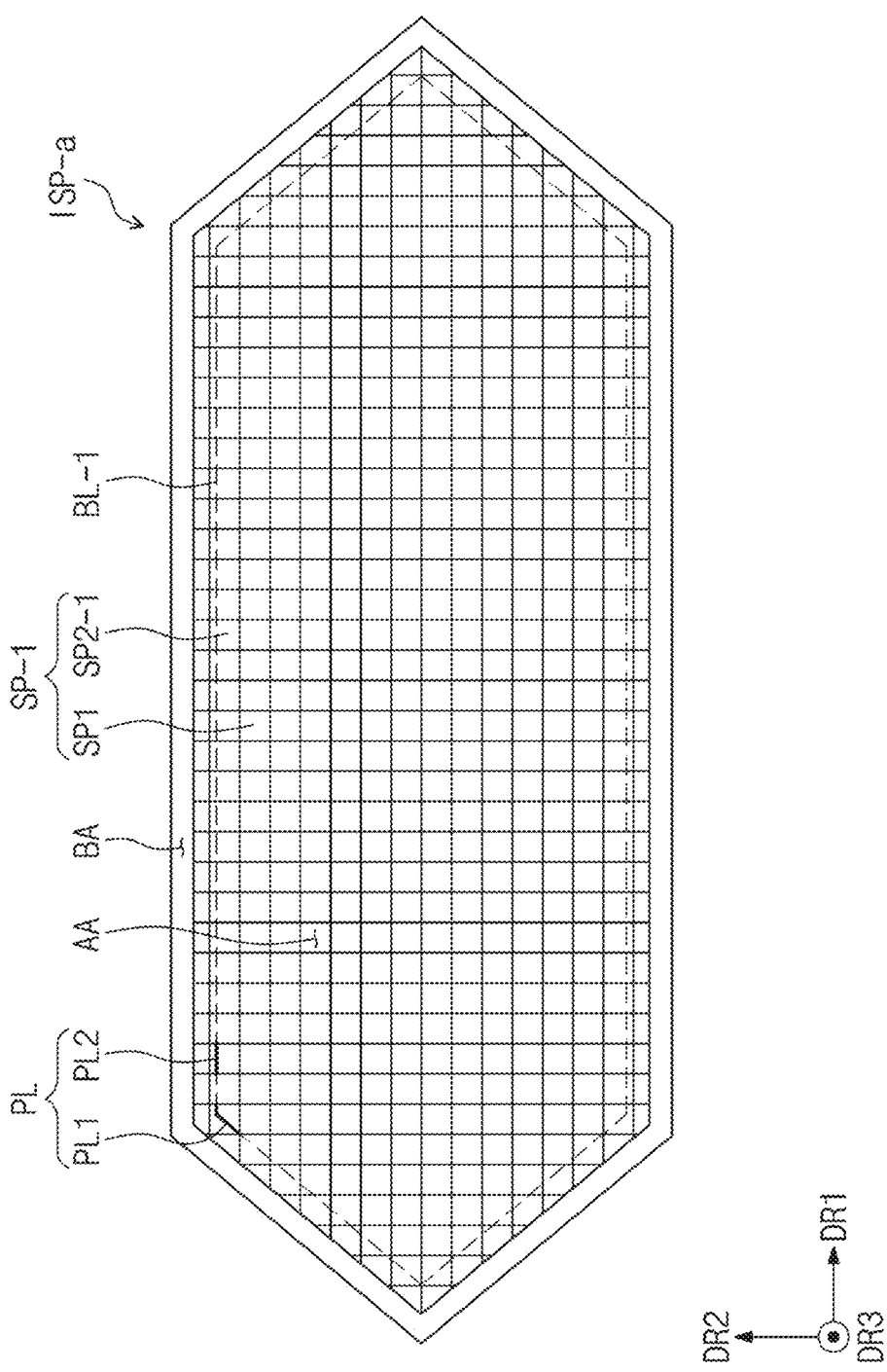
FIG. 13 is a plan view of an input sensing layer according to an embodiment of the present disclosure.

FIG. 13 is a plan view of an input sensing layer ISP-a according to an embodiment of the present disclosure.

In FIG. 13, the same or similar reference numerals denote the same or similar elements as those described above with reference to FIGS. 1 to 10, and thus, redundant description thereof may not be repeated.

Referring to FIG. 13, the input sensing layer ISP-a may include sensing electrodes (SP-1), which include first sensing electrodes SP1 and second sensing electrodes SP2-1. The first sensing electrodes SP1 may be arranged along the first direction DR1 and the second direction DR2. The second sensing electrodes SP2-1 may be arranged along an area boundary BL-1.

In the present embodiment, the area boundary BL-1 between a sensing area AA and a non-sensing area BA may have a polygonal shape. FIG. 13 shows the input sensing layer ISP-a having a hexagonal shape as a representative example.

Accordingly, an electrode boundary PL between a first portion PT1 and a second portion PT2, which overlaps with the area boundary BL, may have a straight line shape or a polygonal shape. As an example, a first electrode boundary PL1 may have the polygonal shape, and a second electrode boundary PL2 may have the straight line shape.

According to the display device including the input sensing layer with the irregular shape, the touch sensitivity at the outer portion of the display device according to some embodiments of the present disclosure may be improved.

Some embodiments of the present disclosure may provide a display device including a display panel. The display panel may include a base layer including a display area, and a non-display area adjacent to the display area. A display element layer may be disposed on the base layer, and an input sensing layer may be disposed on the display element layer. The input sensing layer may include a first sensing insulating layer, a conductive layer disposed on the first sensing insulating layer and including a sensing area overlapping with the display area and a non-sensing area overlapping the non-display area, and a second sensing insulating layer disposed on the conductive layer.

The conductive layer may include first sensing electrodes overlapping with the sensing area, second sensing electrodes, each including a first portion overlapping with the sensing area and a second portion connected to the first portion and overlapping with the non-sensing area, and trace lines connected to the first sensing electrodes and the second sensing electrodes.

Each of the first sensing electrodes may have a polygonal shape.

Each of the first portions included in the second sensing electrodes may have a shape obtained by cutting out a portion of the first sensing electrodes.

Each of the trace lines may be connected to the first sensing electrodes and the second sensing electrodes in the display area.

An area boundary between the display area and the non-display area may have a circular shape.

An electrode boundary between the first portion and the second portion, which overlaps with the area boundary, may have a curved-line shape.

An area boundary between the display area and the non-display area may have a polygonal shape.

An electrode boundary between the first portion and the second portion, which overlaps with the area boundary, may have a straight line shape or a polygonal shape.

Each of the first sensing electrodes and the first portions may include a first conductive line including first mesh lines extending in a first diagonal direction and second mesh lines extending in a second diagonal direction.

The first mesh lines and the second mesh lines crossing the first mesh lines may define first mesh openings.

The display element layer may include pixels including a light emitting element, and a pixel definition layer through which a pixel opening is defined.

An area where the display element is exposed through the pixel opening may be defined as a light emitting area.

The light emitting area may overlap with each of the first mesh openings.

The light emitting area may include a first light emitting area, a second light emitting area, and a third light emitting area. The first light emitting area may display a red color, may extend in a first diagonal direction between a first direction and a second direction crossing the first direction, and may have a bar shape. The second light emitting area may display a green color, may extend in the first diagonal direction, and may have a bar shape. The third light emitting area may display a blue color, and may have a lozenge shape.

The second portions may include a second conductive line including third mesh lines extending in the first diagonal direction and fourth mesh lines extending in the second diagonal direction.

The third mesh lines and the fourth mesh lines crossing the third mesh lines may define second mesh openings.

The second conductive line included in the second portions may have a line width greater than a line width of the first conductive line included in the first portions.

Each of the second portions may have a continuous shape without being disconnected in an area overlapping with the non-display area.

The display element layer may include light emitting elements.

The second mesh openings may not overlap with the light emitting elements.

The second sensing electrode may have a size equal to or greater than about 0.9 times and equal to or smaller than about 1.1 times a size of the first sensing electrode in a plan view.

The display element layer may include a first electrode, and a second electrode disposed on the first electrode and overlapping with at least a portion of the non-display area.

The second portions may overlap with the second electrode.

The second sensing electrode may have a capacitance equal to or greater than about 0.9 times and equal to or smaller than about 1.1 times a capacitance of the first sensing electrode.

The second sensing electrodes may include first, second, and third portions.

The first, second, and third portions may be connected to each other, and may be provided integrally with each other.

The display device may further include an integrated circuit disposed at one side of the display panel.

The trace lines may not overlap with each other, may extend in a direction toward the one side, and may be connected to the integrated circuit.

The first sensing electrodes may have a rectangular shape in a plan view, and may be arranged along a first direction and a second direction perpendicular to the first direction.

The second sensing insulating layer may cover the conductive layer.

An edge of the second sensing insulating layer may be spaced apart from an edge of the display panel.

Each of the first sensing electrode and the second sensing electrode may be a self-capacitance touch sensor.

According to some embodiments, the electrodes that are adjacent to a boundary between the display area and the non-display area may be expanded to an area overlapping with the non-display area, and thus, sensing sensitivity may be improved.

According to some embodiments of the present disclosure, a location and a range of the sensing electrodes may be changed during a manufacturing process of the sensing electrodes, and thus, the manufacturing process that is comparatively used for the display device may be identically or similarly employed. Therefore, the display device according to some embodiments of the present disclosure may be manufactured more easily and economically without changing existing production equipment.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel comprising:
a base layer comprising a display area, and a non-display area adjacent to the display area; and
a display element layer on the base layer; and
an input sensing layer on the display element layer, and comprising:
a first sensing insulating layer;
a conductive layer on the first sensing insulating layer, and comprising a sensing area overlapping with the display area, and a non-sensing area overlapping with the non-display area; and
a second sensing insulating layer on the conductive layer, wherein the conductive layer comprises:
first sensing electrodes overlapping with the sensing area;

second sensing electrodes, each comprising a first portion overlapping with the sensing area, and a second portion connected to the first portion and overlapping with the non-sensing area; and
trace lines connected to the first sensing electrodes and the second sensing electrodes,
wherein some of the second sensing electrodes comprise the first portion and the second portion to have a size that is substantially equal to or less than a size of the first sensing electrodes, and
wherein others of the second sensing electrodes further comprise a third portion integral with the first portion or the second portion to have a size that is greater than the size of the first sensing electrodes.

2. The display device of claim 1, wherein each of the first sensing electrodes has a polygonal shape, and
wherein the first portion of each of the second sensing electrodes has a shape corresponding to a cut out of a portion of the first sensing electrodes.

3. The display device of claim 1, wherein each of the trace lines is connected to a corresponding one of the first sensing electrodes or a corresponding one of the second sensing electrodes in the display area.

4. The display device of claim 1, wherein an area boundary between the display area and the non-display area has a circular shape, and
wherein an electrode boundary overlapping with the area boundary between the first portion and the second portion has a curved-line shape.

5. The display device of claim 1, wherein an area boundary between the display area and the non-display area has a polygonal shape, and
wherein an electrode boundary overlapping with the area boundary between the first portion and the second portion has a straight line shape or a polygonal shape.

6. The display device of claim 1, wherein each of the first sensing electrodes and the first portion comprises a first conductive line comprising first mesh lines extending in a first diagonal direction, and second mesh lines extending in a second diagonal direction and crossing the first mesh lines, and
wherein the first mesh lines and the second mesh lines cross each other to define first mesh openings.

7. The display device of claim 6, wherein the display element layer comprises pixels comprising:
a light-emitting element; and
a pixel definition layer through which a pixel opening is defined, and
wherein a light-emitting area defined by an area where the light-emitting element is exposed through the pixel opening overlaps with each of the first mesh openings.

8. The display device of claim 7, wherein the light-emitting area comprises:
a first light-emitting area configured to display a red color, extending in the first diagonal direction between a first direction and a second direction crossing the first direction, and having a bar shape;
a second light-emitting area configured to display a green color, extending in the first diagonal direction, and having a bar shape; and
a third light-emitting area configured to display a blue color, and having a lozenge shape.

9. The display device of claim 6, wherein the second portion comprises a second conductive line comprising third mesh lines extending in the first diagonal direction, and fourth mesh lines extending in the second diagonal direction and crossing the third mesh lines, and wherein the third mesh lines and the fourth mesh lines cross each other to define second mesh openings.

10. The display device of claim 9, wherein each of the second portions has a continuous shape without being disconnected in an area overlapping with the non-display area.

11. The display device of claim 9, wherein the display element layer comprises light-emitting elements, and wherein the second mesh openings do not overlap with the light-emitting elements.

12. The display device of claim 1, wherein the second sensing electrodes are between about 0.9 times to about 1.1 times of the size of the first sensing electrodes in a plan view.

13. The display device of claim 1, wherein the display element layer comprises:

a first electrode; and a second electrode on the first electrode, and overlapping with at least a portion of the non-display area, and wherein the second portion of each of the second sensing electrodes overlaps with the second electrode.

14. The display device of claim 1, wherein the second sensing electrodes have a capacitance greater than or equal to about 0.9 times and smaller than or equal to about 1.1 times of a capacitance of the first sensing electrodes.

15. The display device of claim 1, wherein the first and second portions are respectively connected to each other and integral with each other.

16. The display device of claim 1, further comprising an integrated circuit at one side of the display panel, wherein the trace lines do not overlap with each other, extend in a direction toward the one side, and are connected to the integrated circuit.

17. The display device of claim 1, wherein the first sensing electrodes have a rectangular shape in a plan view, and are arranged along a first direction and a second direction perpendicular to the first direction.

18. The display device of claim 1, wherein the second sensing insulating layer covers the conductive layer, and wherein an edge of the second sensing insulating layer is spaced from an edge of the display panel.

19. The display device of claim 1, wherein each of the first sensing electrodes and the second sensing electrodes is a self-capacitance touch sensor.

20. A display device comprising:

a display panel comprising:

a base layer comprising a display area, and a non-display area adjacent to the display area; and a display element layer on the base layer; and an input-sensing layer on the display element layer, and comprising:

a first sensing insulating layer;

a conductive layer on the first sensing insulating layer, and comprising a sensing area overlapping with the display area, and a non-sensing area overlapping with the non-display area; and a second sensing insulating layer on the conductive layer, wherein the conductive layer comprises:

first sensing electrodes overlapping with the sensing area;

second sensing electrodes, each comprising a first portion overlapping with the sensing area, and a second portion connected to the first portion and overlapping with the non-sensing area; and trace lines connected to the first sensing electrodes and the second sensing electrodes, wherein each of the first sensing electrodes and the first portion comprises a first conductive line comprising first mesh lines extending in a first diagonal direction, and second mesh lines extending in a second diagonal direction and crossing the first mesh lines, wherein the first mesh lines and the second mesh lines cross each other to define first mesh openings, wherein the second portion comprises a second conductive line comprising third mesh lines extending in the first diagonal direction, and fourth mesh lines extending in the second diagonal direction and crossing the third mesh lines, wherein the third mesh lines and the fourth mesh lines cross each other to define second mesh openings, and wherein the second conductive line of the second portions has a line width that is greater than a line width of the first conductive line of the first portions.

\* \* \* \* \*